(12) United States Patent
Calmel

(10) Patent No.: US 10,483,914 B2
(45) Date of Patent: Nov. 19, 2019

(54) VERY HIGH FIDELITY AUDIO AMPLIFIER

(71) Applicant: DEVIALET, Paris (FR)

(72) Inventor: Pierre-Emmanuel Calmel, Le Chesnay (FR)

(73) Assignee: DEVIALET, Paris (FR)

( * ) Notice: Subject to any disclaimer, the term of this patent is extended or adjusted under 35 U.S.C. 154(b) by 0 days.

(21) Appl. No.: 15/322,936

(22) PCT Filed: Jun. 30, 2015

(86) PCT No.: PCT/EP2015/064895
§ 371 (c)(1),
(2) Date: Feb. 10, 2017

(87) PCT Pub. No.: WO2016/001253
PCT Pub. Date: Jan. 7, 2016

(65) Prior Publication Data
US 2017/0207750 A1    Jul. 20, 2017

(30) Foreign Application Priority Data

Jun. 30, 2014 (FR) ..................................... 14 56208

(51) Int. Cl.
*H03F 3/68* (2006.01)
*H03F 1/02* (2006.01)
(Continued)

(52) U.S. Cl.
CPC ............... *H03F 1/02* (2013.01); *H03F 3/181* (2013.01); *H03F 3/183* (2013.01); *H03F 3/217* (2013.01);
(Continued)

(58) Field of Classification Search
CPC ... H03F 3/38; H03F 3/68; H03F 3/181; H03F 3/217
(Continued)

(56) References Cited

U.S. PATENT DOCUMENTS 5,969,571 A * 10/1999 Swanson ............... H03F 3/2178
330/10
6,937,095 B2 * 8/2005 Joffe ....................... H03F 3/217
330/207 A
(Continued)

FOREIGN PATENT DOCUMENTS

FR         2828582 A1     2/2003
GB         434632 A       9/1935
(Continued)

OTHER PUBLICATIONS

International Search Report of the ISA dated Sep. 28, 2015 issued in corresponding PCT International Application No. PCT/EP2015/064895.
(Continued)

*Primary Examiner* — Steven J Mottola
(74) *Attorney, Agent, or Firm* — Troutman Sanders LLP

(57) ABSTRACT

Disclosed is the audio amplifier comprising an input for an audio signal to be amplified and an output for powering a load on the basis of the amplified audio signal; a generator of reference voltage of very high linearity and low output impedance, able to receive, as input, the audio signal to be amplified; a power current generator comprising a power voltage generator whose output is connected to the output of the reference voltage generator through a coupling impedance. The coupling impedance comprises two coupling inductances mounted in series between the output of the reference generator and the output of the power voltage generator and an attenuation impedance linking a mid-point between the two coupling inductances and a reference potential, wherein the attenuation impedance includes an attenuation inductance.

17 Claims, 3 Drawing Sheets

(51) Int. Cl.
  *H03F 3/181* (2006.01)
  *H03F 3/217* (2006.01)
  *H03F 3/183* (2006.01)
  *H03F 3/45* (2006.01)

(52) U.S. Cl.
  CPC ..... *H03F 3/45475* (2013.01); *H03F 2200/03* (2013.01); *H03F 2200/351* (2013.01); *H03F 2200/391* (2013.01); *H03F 2200/432* (2013.01); *H03F 2200/534* (2013.01)

(58) Field of Classification Search
  USPC ................................ 330/10, 124 R; 381/120
  See application file for complete search history.

(56) References Cited

U.S. PATENT DOCUMENTS

2002/0053945 A1* 5/2002 Putzeys ................. H03F 3/217
                                                        330/10
2003/0034796 A1  2/2003 Tsujiguchi
2011/0050363 A1  3/2011 Lo Hine Tong et al.
2014/0050335 A1  2/2014 Moronvalle

FOREIGN PATENT DOCUMENTS

| | | |
|---|---|---|
| JP | S57171809 A | 10/1982 |
| WO | 2004057754 A1 | 7/2004 |
| WO | 2011107669 A1 | 9/2011 |

OTHER PUBLICATIONS

French Search Report dated Apr. 30, 2015 issued in corresponding French Application No. 1456208.

Nam-In Kim et al., (2002) "Ripple feedback filter suitable for analog/digital mixed-mode audio amplifier for improved efficiency and stability" Power Electronics Specialists Conference, vol. 1, pp. 45-49, XP010596063.

Dardillac S. et al., (2003) "Highly selective planar filter using negative resistances for loss compensation" Microwave Conference, 33rd European Oct. 7-9, 2003, Piscataway, NJ, USA, IEEE, vol. 2, pp. 821-824, XP010681021.

\* cited by examiner

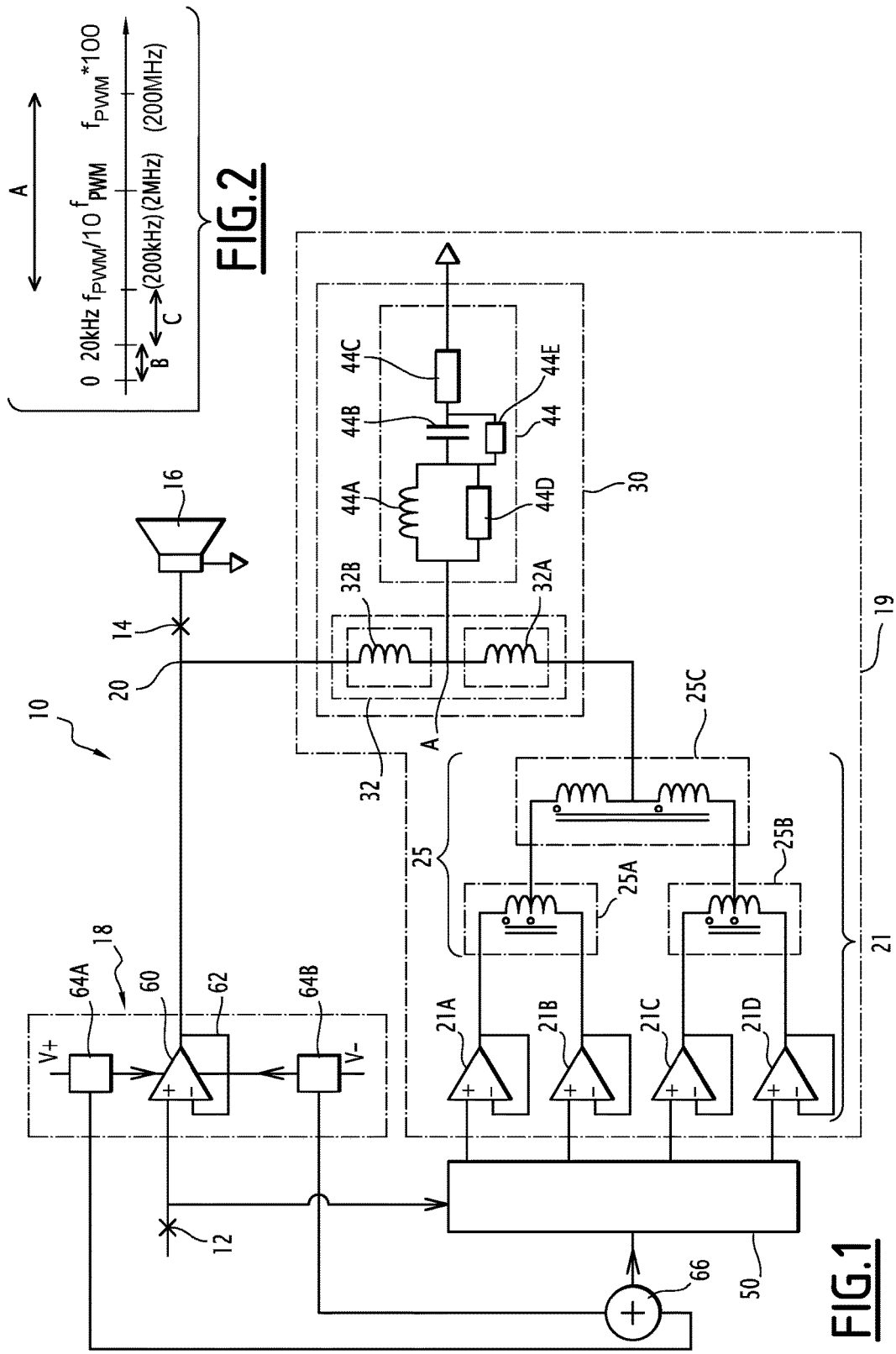

VERY HIGH FIDELITY AUDIO AMPLIFIER

CROSS-REFERENCE TO RELATED APPLICATIONS

This application is a National Stage of International Application No. PCT/EP2015/064895, filed Jun. 30, 2015. This application, in turn, claims priority to French Patent Application No. 1456208, filed Jun. 30, 2014. Both applications are incorporated herein by reference.

FIELD OF THE INVENTION

The present invention relates to a very high fidelity audio amplifier with low distortion and high performance of the type including:
an input for an audio signal to be amplified and an output for powering a load on the basis of the amplified audio signal;
a generator of reference voltage of very high linearity and low output impedance, able to receive, as input, the audio signal to be amplified;
a power current generator including a power voltage generator whose output is connected to the output of the reference voltage generator through a coupling impedance;
the coupling impedance includes two coupling inductances mounted in series between the output of the reference generator and the output of the power voltage generator and an attenuation impedance linking a mid-point between the two coupling inductances and a reference potential.

BACKGROUND

Patent application WO-2011/107,669 describes the coupling of a class A analog amplifier, made up of a reference voltage generator and a class D digital amplifier constituting a power voltage generator, which is coupled to the output of the reference voltage generator by an inductance, with which it then forms a current source.

The combination of a class A amplifier and a class D amplifier is intended to create an amplifier with a very high performance and very high linearity.

In practice, several phenomena limit the total performance of such an amplifier, its ability to reproduce high frequencies, and its maximum achievable power. These phenomena are in particular the following.

The switching losses of the MOS transistors of the class D amplifier subject to PWM control are proportional to the switching frequency. For this reason, in practice, this frequency cannot significantly exceed 500 kHz for voltages greater than 100 volts. Due to the PWM control and the inductive aspect of the coupling impedance, a ripple current is formed in the coupling impedance.

The amplitude of the current ripple in the impedance of the class D amplifier is inversely proportional to the switching frequency and inversely proportional to the value of the inductance. However, to be capable of reproducing the top of the audio spectrum, the used inductance must have a low value so as not to limit the slew rate in the audio band. Unfortunately, this low inductance value leads to a ripple current amplitude at the class D switching frequency with a high value. Yet this high-frequency current ripple is completely absorbed and dissipated by the class A analog amplifier, which causes significant heat dissipation.

Under these conditions, the class A amplifier is highly stressed when reproducing high frequencies, in particular exceeding 10 kHz.

There are two known solutions to decrease or cancel the high-frequency ripple of the class D amplifiers.

A first solution consists of using a wave trap (RLC) tuned to the working frequency of the class D PWM control, this wave trap being placed at the output of the amplifier powering the load.

This solution has two drawbacks, namely cancelling out only the fundamental of the high-frequency current ripple and introducing a phase shift affecting the harmonics of the signal, which is very detrimental to the feedback control of the control loop.

The second solution consists of using a "ripple steering" technique described in the AES Society publications. This technical is based to two strong structural hypotheses, namely:
a mandatory bridge operation of two class D amplifiers, the load not being connected to the ground, and
an operation of the two class D amplifiers in phase opposition.

These hypotheses are often unwanted in an amplifier.

The D-Premier amplifier is also known, marketed by the company Devialet, which uses, as coupling impedance, two inductors mounted in series and the midpoint of which is connected to the ground by a resistance. The purpose of this resistance is to absorb the very high-frequency energy (in a frequency band greater than 20 MHz) due to the switching of the MOS transistor bridges present in the class D amplifier and does not contribute to the current ripple.

SUMMARY

The invention aims to improve the ratio of current supplied by the class A amplifier to the current supplied by the class D amplifier for high frequencies, thus making it possible to reduce the heating of the class A amplifier while increasing the working bandwidth and the linearity of the system.

To that end, the invention relates to an audio amplifier of the aforementioned type, characterized in that the attenuation impedance includes an attenuation inductance.

According to specific embodiments, the acoustic enclosure includes one or more of the following features:
the value of the attenuation inductance is much lower than the individual value of the two coupling inductances;
this value of the attenuation inductance less than one tenth of the individual value of the coupling inductances;
the attenuation impedance includes a capacitor mounted in series with the attenuation inductance;
the capacity C of the capacitor is such that the ratio at $1/|jC\omega|$ is much lower than the value $|jL_3\omega|$ of the inductance attenuation impedance $L_3$ and preferably less than $1/10^{th}$ of this value, where $\omega$ is the angular frequency of the signal, for angular frequency values comprised between $1/10 \cdot 2\pi \cdot f_{PWM}$ and $10 \cdot 2\pi \cdot f_{PWM}$, $f_{PWM}$ being the fundamental frequency of a current ripple in the coupling inductance;
the capacity C of the capacitor is such that the ratio at $1/|jC\omega|$ is greater than the impedance of the load and preferably more than 10 times this value, where $\omega$ is the angular frequency of the signal less than $1/10 \cdot 2\pi \cdot f_{PWM}$, $f_{PWM}$ being the fundamental frequency of a current ripple in the coupling inductance;
the attenuation impedance includes a resistance mounted in series with the attenuation inductance;

the value of the resistance is greater than $|jL_2\omega|$ and preferably more than 10 times this value, where $L_2$ is the minimum value of the coupling inductance and $\omega$ is the angular frequency of the signal, for angular frequency values below $1/100 \cdot 2\pi \cdot f_{PWM}$, $f_{PWM}$ being the fundamental frequency of a current ripple in the coupling inductance;

the attenuation impedance is a RLC circuit;

the attenuation impedance includes a resistance mounted in parallel with the attenuation inductance;

the value of the resistance is significantly greater than $|jL_3\omega|$ and preferably greater than ten times this value, where $L_3$ is the value of the inductance and $\omega$ is the angular frequency of the signal, for angular frequency values comprised between $1/10 \cdot 2\pi \cdot f_{PWM}$ and $10 \cdot 2\pi \cdot f_{PWM}$, $f_{PWM}$ being the fundamental frequency of a current ripple in the coupling inductance;

the attenuation impedance includes a resistance mounted in parallel with the capacitor; and the power current generator includes several power voltage generators receiving, as input, the same phase-shifted signals and at least one autotransformer connecting the outputs of the power voltage generators to one another and whose output is connected to the coupling impedance.

BRIEF DESCRIPTION OF THE DRAWINGS

The invention will be better understood upon reading the following description, provided solely as an example and done in reference to the drawings, in which:

FIG. 1 is an electrical diagram of a high-fidelity audio amplifier with low distortion and very high performance according to a first embodiment of the invention;

FIG. 2 is a frequency scale explaining the different operating zones of the amplifier;

DETAILED DESCRIPTION

Figure 3:
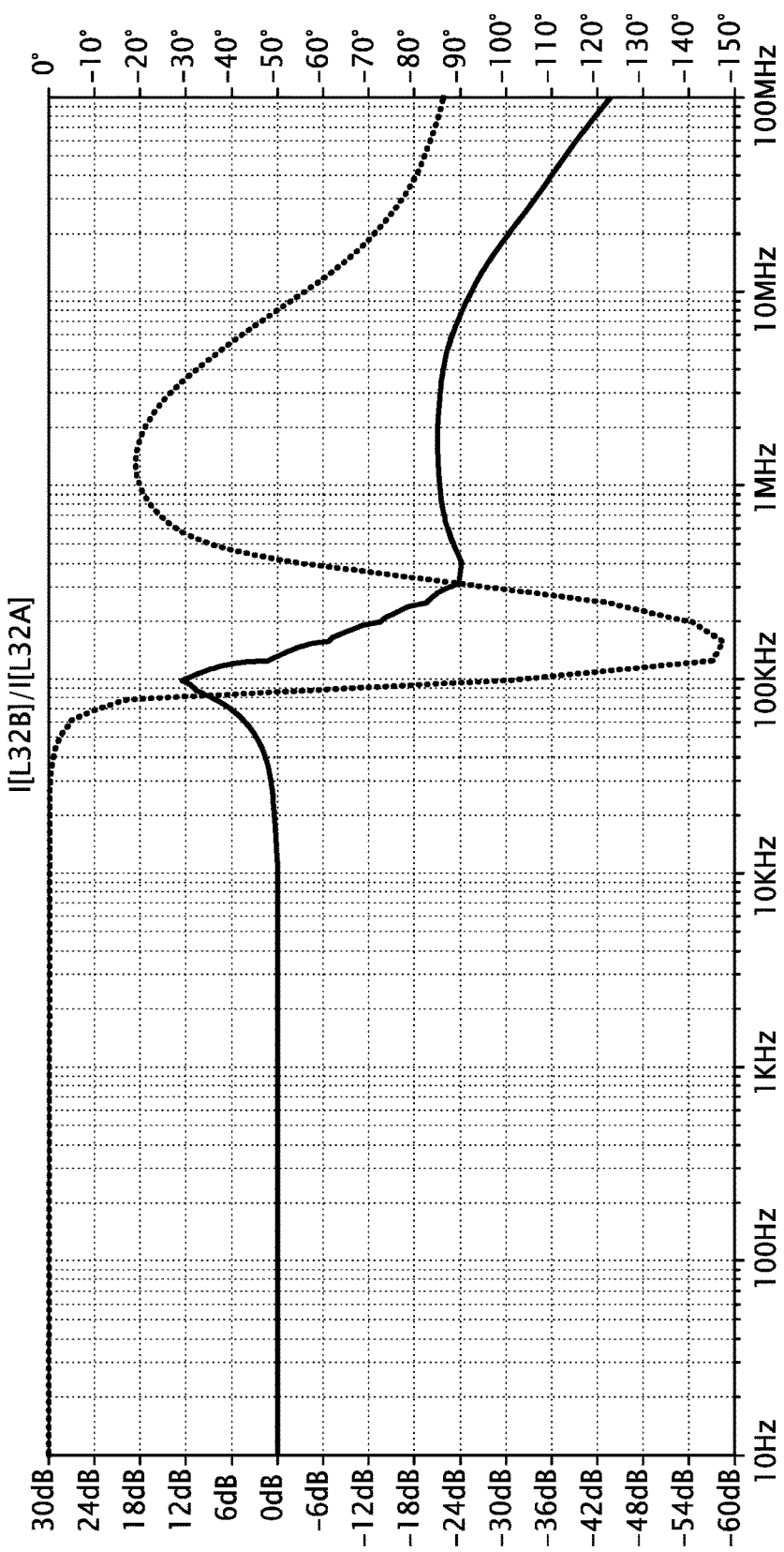
FIG. 3 is a graph of a transfer function.

The audio amplifier 10 shown in FIG. 1 includes an input 12 able to receive an analog audio signal to be amplified $V_{in}$ and an output 14 providing the amplified signal to which a load consisting of a speaker 16 is connected. The speaker 16 is directly connected, without the resistive element, between the output 14 of the amplifier and the ground.

The input 12 of the amplifier is able to receive a control voltage, the reference of which is the ground.

The amplifier 10 includes a reference voltage generator 18 with a very high linearity and low output impedance forming a class A amplifier and a power current source 19 forming a class D amplifier, both outputs of which are directly coupled to form the output 14 of the amplifier at a coupling point 20.

The power current source 19 comprises a power voltage generator 21 formed on the one hand by four elementary power voltage generators 21A, 21B, 21C, 21D, the outputs of which are connected in pairs by a chain 25 of autotransformers, and on the other hand, a coupling impedance 30 connected at the output of the chain of autotransformers and through which the voltage generators 21A, 21B, 21C, 21D are coupled to the reference voltage generator 18. The coupling impedance 30 is primarily formed by an inductance having a low resistance.

The input of the reference voltage generator 18 is connected to the input 12 of the amplifier, while the output of the reference voltage amplifier 18 is directly connected to the output 14 without inserting any resistive, capacitive or inductive element.

The outputs of the voltage generators 18 and 21 are connected to the coupling point 20, through the coupling inductance 30, which is arranged between the output of the chain 25 of autotransformers and the coupling point 20.

In the considered embodiment, the impedance 30 comprises two inductances 32A, 32B mounted in series and the interconnection midpoint of which is connected to the ground by an attenuation impedance 44.

The chain autotransformers includes two autotransformers 25A, 25B, the two inputs of the primary of which are respectively connected to the outputs of the power voltage generators 21A, 21B on the one hand, and 21C, 21D on the other hand. The output of each autotransformer 25A, 25B, formed by a shunt at an intermediate point of the primary, is connected to a third autotransformer 25C, the output of which, making up the output of the chain of autotransformers, is connected to the coupling impedance 30.

The power current source 19 is controlled by a control unit 50.

The reference voltage generator 18 includes a voltage amplifying stage 60 diagrammed by a differential amplifier whose non-inverting input is directly connected to the input 12 and whose inverting input is connected to an inverse feedback loop 62 directly connected to the output of the differential amplifier 60. Preferably, the voltage amplifying stage is for example formed by an operational amplifier mounted as a voltage follower.

The reference voltage generator 18 is a class A amplifier having a very high linearity and a low output impedance. Preferably, the output impedance of the reference voltage generator is less than 0.2 Ohms.

The differential amplifier 60 is powered by two direct voltages $V_+$ and $V_-$ and consumes a current respectively denoted $I_+$ and $I_-$ on each of these power inputs.

Means for measuring the consumed current 64A, 64B are provided on each of the power inputs of the differential amplifier 60.

These means are for example formed by current detectors, as described in document U.S. Pat. No. 6,937,095. They are able to provide information representative of the current provided at the output by the reference voltage generator, the current $i_A$ formed by the generator 18 being directly related to the current it consumes.

The outputs of the current sensors 64A, 64B are connected to a summer 66 whose output provides the current $i_A$ consumed by the reference voltage generator and therefore the current provided at the output of this same amplifier. The control unit 50 in particular includes a linear regulator, not shown, receiving the current $i_A$ as input while being connected to the output of the summer 66.

The control unit 50 is connected by another input to the input 12, to receive the musical signal $V_{in}$ to be amplified.

According to a first embodiment, the regulator is a proportional integral (PI) regulator integrating only a linear amplifying stage and an integration stage with no derivative stage. Alternatively, the regulator is a proportional integral derivative (PID) stage including all three stages.

The control unit 50 includes four outputs producing a same control signal phase-shifted by 90°. Each output is connected to an input of a power voltage generator 21A, 21B, 21C, 21D.

Thus, the power current generator 19 and therefore each power voltage generator 21A, 21B, 21C, 21D are able to receive, as input, a combination of the audio signal to be amplified $V_{in}$ from the input 12 and a value representative of the current $i_A$ consumed by the reference voltage generator 18.

In the considered example, each power voltage generator 21A, 21B, 21C, 21D is made up of a differential amplifier mounted as a follower, and the inverting input of which is directly connected to the output by an inverse feedback loop. Its non-inverting input is connected to an output of the control unit 50.

According to a first embodiment, the differential amplifier mounted as a follower is made up of a class D amplifier, i.e., an amplifier of the "push/pull" type, including, along its amplifier branch, two "MOSFET" transistors mounted in anti-series, these two transistors being controlled using a pulse width modulation law, at a frequency denoted $f_{PWM}$ for example equal to 2 MHz.

According to another embodiment, each power voltage generator 20 is made up of a class A or class AB amplifier.

Advantageously, the coupling inductance 30 has a modulus less than ten times the modulus of the load, i.e., of the speaker 16, in the working frequency range.

Thus, for example, for a speaker whose resistance is 4 Ohms, the impedance 30 used in the case of a class an amplifier to form the power current generator 19 is advantageously less than 5 µH to effectively reproduce the audio spectrum up to 20 kHz. Alternatively, in the case of an amplifier intended for a subwoofer limited to 200 Hz for example, the value of the inductance may reach 500 µH.

The total value of the inductance formed by the inductance is 32A, 32B is comprised between 0.1 µH and 1000 µH. There resistance is very low, advantageously less than 0.1 Ω.

The inductances 32A and 32B have substantially equal impedance values, and preferably with a difference of less than 50%.

The attenuation impedance 44 advantageously includes an inductance 44A. In the embodiment, the inductance 44A is mounted in series, in the attenuation impedance 44, with a capacitor 44B and a resistance 44C to form a serial RLC circuit. Furthermore, a resistance 44D is mounted in parallel with the inductance 44A in the attenuation impedance 44. Likewise, advantageously, a resistance 44E is mounted in parallel with the capacitor 44B. The resistance 44E is intended to damp any oscillations across the terminals of the capacitor 44B. The value of the resistance 44E is comprised between 100 Ω [sic], advantageously it is 10 kΩ.

The value $L_3$ of the inductance 44A is much lower than the individual value, denoted $L_1$ and $L_2$, of the two inductances 32A and 32B.

Preferably, this value of the inductance 44A is less than $1/10^{th}$ of the value of the inductances 32A and 32B.

Furthermore, the value of the resistance 44D is significantly greater than $|jL_3\omega|$ and preferably greater than ten times this value, where $L_3$ is the value of the inductance 44A and $\omega$ is the angular frequency of the signal, for angular frequency values comprised between $1/10 \cdot 2\pi \cdot f_{PWM}$ and $10 \cdot 2\pi f_{PWM}$.

The value of the resistance 44C is significantly greater than $1/|jL_2\omega|$ and preferably more than 10 times this value, where $L_2$ is the minimum value of the inductances 32A and 32B and $\omega$ is the angular frequency of the signal, for angular frequency values below $1/100 \cdot 2\pi \cdot f_{PWM}$.

The value of the resistance 44C is comprised between 0.1 and 10 Ω. This resistance is used to damp any oscillations of the resonant circuits LC formed by the inductance 44A and the capacitor 44B.

The capacity C of the capacitor 44B is such that the ratio at $1/|jC\omega|$ is significantly greater than the impedance of the load 16 and preferably more than 10 times this value, where $\omega$ is the angular frequency of the signal less than $1/10 \cdot 2\pi \cdot f_{PWM}$.

The capacity C of the capacitor 44B is such that the value of its impedance [sic] the ratio $1/|jC\omega|$ is much lower than the value of the impedance $|jL_3\omega|$ of 44A, the value of the impedance 44A and preferably less than $1/10^{th}$ of this value, where $\omega$ is the angular frequency of the signal, for angular frequency values comprised between $1/10 \cdot 2\pi \cdot f_{PWM}$ and $10 \cdot 2\pi \cdot f_{PWM}$.

According to a first embodiment, the attenuation impedance 44 does not include a resistance 44E placed in parallel with the capacitor 44B.

The value of the resistance 44D is comprised between 10 Ω and 1 Ω, and is preferably substantially equal to 100 Ω.

In such an assembly, the ripple is reduced by connecting several class D amplifiers formed by power voltage generators 21A, 21B, 21C, 21D, each working with a carefully chosen phase shift, here of 90°, so as to:

completely cancel the high-frequency ripple for certain specific duty cycle values, via a coupling by autotransformers, create a regulator of the multi-level PWM that amounts, regarding the ripple to be divided, to dividing the power voltage by the number of phases, therefore consequently, the value of the ripple current, multiplying the frequency of the PWM regulator resulting from the filtering of the phases by the number of coupled phases; thus, coupling four phases at 400 kHz is equivalent to a single PWM regulator working at 1.6 MHz.

As diagrammed in FIG. 2, the attenuation impedance 44, associated with the two inductances 32A, 32B in series, behaves like:

an inductive attenuator with a ratio of at least 1/5, not having a significant phase shift in the frequency band A beginning a decade below the switching frequency $f_{PWM}$ of the PWM regulator of the class D amplifier and extending at least one decade above the switching frequency of the PWM regulator of the class D amplifier. In the considered example, the frequency $f_{PWM}$ of the regulator 2 Mhz (coupling of 4 phases at 500 kHz phase shifted by 90° each), and the frequency $f_{PWM}/10$, a decade below the $f_{PWM}$, is equal to 200 kHz while the frequency $f_{PWM}*100$, two decades above of $f_{PWM}$, is equal to 200 MHz.

a Zobel circuit, as commonly used to stabilize the output impedance of the audio amplifiers in the audio band denoted B going from 20 Hz to 20 kHz, a highly damped wave trap, with a low quality factor, at a frequency situated in the C band approximately midway between the high frequency of the audio spectrum to be reproduced equal to 20 kHz and the working frequency of the class D PWM regulator equal to 2 MHz, at a substantially equal frequency where there is no energy to be transmitted and where having a low impedance has no impact on the dissipation of the class A analog amplifier.

Thus, for example, the following values satisfy the relationships set out above:

inductances 32A, 32B of 25 µH each,
inductance 44A of 2.5 µH
resistance 44D of 100 Ω
capacitor 44B of 100 nF
resistance 44E of 10 kΩ
resistance 44C of 3 Ω

The transfer reaction is obtained between the current in the inductances 32A and 32B of FIG. 3 showing the gain and phase shift between the currents in these inductances.

In the audio band (20 Hz-20 kHz), the current in the inductance 32B is identical to the current in the inductance 32A, without phase shift; the circuit is comparable only to the inductances 32A and 32B in series, which is desired, since all of the current of the class D amplifier is provided to the load 16.

In a frequency band extending between 80 kHz and 200 kHz, the circuit has a damped resonance, the phase varies greatly, but there is no energy in this frequency band, so this behavior is not bothersome. The frequency of the resonance is situated slightly above 100 kHz, outside the audio band and more than a decade below the working frequency of the PWM, situated at 2 MHz in the example.

Figure 4:
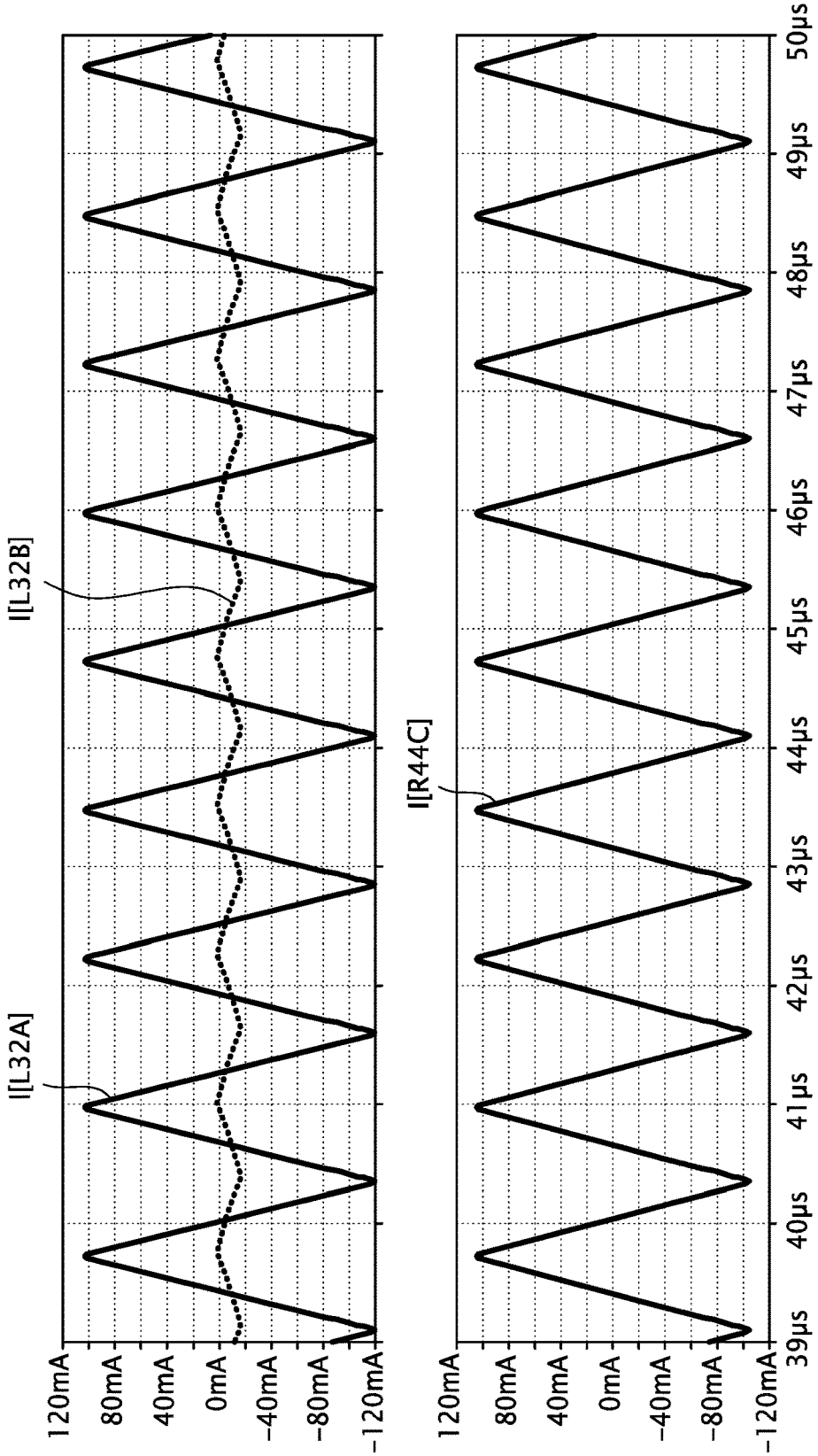
FIG. 4 is a graph of triangle waves used in a digital amplifier.

In a frequency band extending from 200 kHz to 20 MHz, the ratio of the currents in the inductances 32B and 32A is practically constant (I(32B)=0.1*I(32A). From 2 MHz to 20 MHz, the phase variation is very small and is practically linear in frequency: the system then behaves like a constant attenuator doubled by a pure delay, which preserves the triangular shape of the signals used in the feedback control, as shown by FIG. 4, showing the currents in the inductances 32A, 32B and the resistance 44C.

One then obtains the desired result: the high-frequency current from the class D digital amplifier 19 is attenuated by about 20 dB before being coupled to the class A amplifier 18, without significant deformation of the current ripple.

The invention claimed is:

1. An audio amplifier comprising:
    an input for an audio signal to be amplified and an output for powering a load on the basis of the amplified audio signal;
    a generator of reference voltage of very high linearity and low output impedance, able to receive, as input, the audio signal to be amplified;
    a power current generator comprising a power voltage generator whose output is connected to the output of the reference voltage generator through a coupling impedance;
    the coupling impedance comprising two coupling inductances mounted in series between the output of the reference generator and the output of the power voltage generator and an attenuation impedance linking a midpoint between the two coupling inductances and a reference potential,
    wherein the attenuation impedance comprises an attenuation inductance.

2. The amplifier according to claim 1, wherein the value of the attenuation inductance is much lower than the individual value of the two coupling inductances.

3. The amplifier according to claim 2, wherein this value of the attenuation inductance is less than $1/10^{th}$ of the individual value of the coupling inductances.

4. The amplifier according to claim 1, wherein the attenuation impedance comprises a capacitor mounted in series with the attenuation inductance.

5. The amplifier according to claim 4, wherein the capacity of the capacitor is such that the ratio at $1/|jC\omega|$ is much lower than the value $|jL_3\omega|$ of the inductance attenuation impedance $L_3$, where $\omega$ is the angular frequency of the signal, for angular frequency values comprised between $1/10 \cdot 2\pi \cdot f_{PWM}$ and $10 \cdot 2\pi \cdot f_{PWM}$, $f_{PWM}$ being the fundamental frequency of a current ripple in the coupling inductance.

6. The amplifier according to claim 5, wherein the capacity of the capacitor is such that the ratio at $1/|jC\omega|$ is greater than the impedance of the load, where $\omega$ is the angular frequency of the signal less than $1/10 \cdot 2\pi \cdot f_{PWM}$, $f_{PWM}$ being the fundamental frequency of a current ripple in the coupling inductance.

7. The amplifier according to claim 1, wherein the attenuation impedance comprises a resistance mounted in series with the attenuation inductance.

8. The amplifier according to claim 7, wherein the value of the resistance is greater than $|jL_2\omega|$, where $L_2$ is the minimum value of the coupling inductance and $\omega$ is the angular frequency of the signal, for angular frequency values below $1/100 \cdot 2\pi \cdot f_{PWM}$, $f_{PWM}$ being the fundamental frequency of a current ripple in the coupling inductance.

9. The amplifier according to claim 1, wherein the attenuation impedance is a RLC circuit.

10. The amplifier according to claim 1, wherein the attenuation impedance comprises a resistance mounted in parallel with the attenuation inductance.

11. The amplifier according to claim 10, wherein the value of the resistance is significantly greater than $|jL_3\omega|$, where $L_3$ is the value of the inductance and $\omega$ is the angular frequency of the signal, for angular frequency values comprised between $1/10 \cdot 2\pi \cdot f_{PWM}$ and $10 \cdot 2\pi \cdot f_{PWM}$, $f_{PWM}$ being the fundamental frequency of a current ripple in the coupling inductance.

12. The amplifier according to claim 1, wherein the attenuation impedance comprises resistance mounted in parallel with the capacitor.

13. The amplifier according to claim 1, wherein the power current generator comprises several power voltage generators receiving, as input, the same phase-shifted signals and at least one autotransformer connecting the outputs of the power voltage generators to one another and whose output is connected to the coupling impedance.

14. The amplifier according to claim 4, wherein the capacity of the capacitor is such that the ratio at $1/|jC\omega|$ is less than $1/10$th of the value $|jL_3\omega|$ of the inductance attenuation impedance $L_3$, where $\omega$ is the angular frequency of the signal, for angular frequency values comprised between $1/10 \cdot 2\pi \cdot f_{PWM}$, $f_{PWM}$ and $10 \cdot 2\pi f_{PWM}$, $f_{PWM}$ being the fundamental frequency of a current ripple in the coupling inductance.

15. The amplifier according to claim 5, wherein the capacity of the capacitor is such that the ratio at $1/|jC\omega|$ is more than 10 times the impedance of the load, where $\omega$ is the angular frequency of the signal less than $1/10 \cdot 2\pi \cdot f_{PWM}$, $f_{PWM}$ being the fundamental frequency of a current ripple in the coupling inductance.

16. The amplifier according to claim 7, wherein the value of the resistance is more than 10 times $|jL_2\omega|$, where $L_2$ is the minimum value of the coupling inductance and $\omega$ is the angular frequency of the signal, for angular frequency values below $1/100 \cdot 2\pi \cdot f_{PWM}$, $f_{PWM}$ being the fundamental frequency of a current ripple in the coupling inductance.

17. The amplifier according to claim 10, wherein the value of the resistance is greater than ten times $|jL_3\omega|$, where $L_3$ is the value of the inductance and $\omega$ is the angular frequency of the signal, for angular frequency values comprised between $1/10 \cdot 2\pi \cdot f_{PWM}$ and $10 \cdot 2\pi \cdot f_{PWM}$, $f_{PWM}$ being the fundamental frequency of a current ripple in the coupling inductance.

* * * * *